United States Patent [19]
Bhatt et al.

[11] Patent Number: 6,038,137
[45] Date of Patent: Mar. 14, 2000

[54] CHIP CARRIER HAVING A CHIP MOUNTED ON AN ORGANIC DIELECTRIC SUBSTRATE OVERLAID WITH A PHOTOIMAGEABLE DIELECTRIC HAVING CIRCUITRY THEREON

[75] Inventors: Ashwinkumar Chinuprasad Bhatt, Endicott; Subahu Dhirubhai Desai, Vestal; Thomas Patrick Duffy, Endicott; Jeffrey Alan Knight, Endwell, all of N.Y.

[73] Assignee: International Business Machines Corporation, Armonk, N.Y.

[21] Appl. No.: 08/870,848

[22] Filed: Jun. 6, 1997

Related U.S. Application Data

[60] Continuation of application No. 08/655,324, May 21, 1996, abandoned, which is a division of application No. 08/390,344, Feb. 15, 1995, abandoned.

[51] Int. Cl.[7] .................. H05K 1/03; H05K 7/02
[52] U.S. Cl. .................. 361/795; 174/255; 174/258; 361/764; 361/762; 361/707; 361/719; 430/312
[58] Field of Search .................. 174/252, 256, 174/257, 260, 258, 261, 255; 257/692, 697, 700, 706, 707, 711, 712, 713, 719, 720, 723, 724, 728; 361/704, 707, 719, 720, 760, 761, 762, 763, 764, 767, 771, 782, 783, 820; 438/108, 121, 122, 124, 613; 430/311, 312, 315; 439/68, 69, 83, 485; 427/485, 487

[56] References Cited

U.S. PATENT DOCUMENTS

| | | | |
|---|---|---|---|
| 4,731,701 | 3/1988 | Kuo et al. | 361/719 |
| 4,902,610 | 2/1990 | Shipley | 430/312 |
| 5,246,817 | 9/1993 | Shipley, Jr. | 430/312 |
| 5,262,280 | 11/1993 | Knudsen et al. | 430/312 |
| 5,285,352 | 2/1994 | Pastore et al. | 361/707 |
| 5,355,283 | 10/1994 | Marrs et al. | 361/761 |
| 5,444,296 | 8/1995 | Kaul et al. | 257/723 |
| 5,485,038 | 1/1996 | Licari et al. | 257/700 |
| 5,490,324 | 2/1996 | Newman | 257/700 |
| 5,525,834 | 6/1996 | Fischer et al. | 257/713 |
| 5,599,747 | 2/1997 | Bhatt et al. | 437/209 |
| 5,648,200 | 7/1997 | Letize et al. | 430/315 |
| 5,665,525 | 9/1997 | Pienimaa | 430/315 |
| 5,729,894 | 3/1998 | Rostoker et al. | 257/693 |

OTHER PUBLICATIONS

IBM Technical Disclosure Bulletin "Photoformed Chip Carrier" vol. 28 No. 7, Dec. 1985.

*Primary Examiner*—Donald Sparks
*Attorney, Agent, or Firm*—William N. Hogg

[57] ABSTRACT

A chip carrier for wire bond-type chips is disclosed. This chip carrier employs organic dielectric materials, rather than ceramic materials, as is conventional. This chip carrier also employs at least one organic, photoimageable dielectric layer, having plated photo-vias, to electrically interconnect two (or more) layers of fan-out circuitry. This chip carrier further employs a single-tiered cavity to contain a chip, rather than a multi-tiered cavity, as is conventional. Moreover, this chip carrier includes thermal via holes and/or a metallic layer, directly beneath the chip, to enhance heat dissipation.

16 Claims, 2 Drawing Sheets

CHIP CARRIER HAVING A CHIP MOUNTED ON AN ORGANIC DIELECTRIC SUBSTRATE OVERLAID WITH A PHOTOIMAGEABLE DIELECTRIC HAVING CIRCUITRY THEREON

This is a continuation of application Ser. No. 08/655,324, filed on May 21, 1996 now abandon, which is a divisional applicational of application Ser. No. 08/390,344 filed Feb. 15, 1995 now abandoned.

BACKGROUND OF THE INVENTION

1. Field of the Invention

The invention pertains generally to organic chip carriers for wire bond-type chips.

2. Description of the Related Art

Semiconductor integrated circuit devices (hereinafter referred to as semiconductor chips or just chips) are typically electronically packaged by mounting one or several chips onto a ceramic, e.g., alumina, chip carrier substrate and using wire bonds to electrically connect I/O (input/output) contact pads on each chip to corresponding contact pads (and therefore to corresponding fan-out circuitry) on the ceramic chip carrier substrate. The resulting ceramic chip carrier is then mounted onto a printed circuit board (PCB) or printed circuit card (PCC) and (via circuitry on the PCB or PCC) thereby electrically connected to other such ceramic chip carriers and/or other electronic components mounted on the PCB or PCC.

While the above-described packaging scheme is certainly useful, the use of ceramic chip carrier substrates does involve certain limitations and drawbacks. For example, as is known, the speed of propagation of an electrical signal through a wire on a dielectric layer, or between two dielectric layers, is proportional to the inverse of the square root of the dielectric constant of the dielectric layer or layers. Unfortunately, the dielectric constants of ceramics are relatively large, e.g., the dielectric constant of alumina is about 9, which results in ceramic chip carriers exhibiting relatively low, and in some cases undesirably low, signal propagation speeds.

The use of ceramic chip carrier substrates also leads to certain I/O constraints. For example, a single-layer ceramic chip carrier substrate includes but a single layer of fan-out circuitry on the upper surface of the single ceramic layer, extending to contact pads around the outer periphery of the single ceramic layer. (A lead frame, having inner leads connected to these peripheral contact pads, is typically used to electrically connect such a ceramic chip carrier to a PCB or PCC.) However, as the number of chip I/Os has increased, it has been necessary to increase the number of fan-out wires, and to correspondingly decrease the spacing between the fan-out wires, to the point where undesirable cross-talk between adjacent fan-out wires has become unacceptable. Moreover, it has become increasingly difficult, if not impossible, to form a correspondingly large number of contact pads around the outer periphery of the ceramic layer. Thus, single-layer ceramic chip carrier substrates are definitely limited in their ability to handle high I/O chips.

Attempts to accomodate chips having relatively large numbers of I/Os has led to the use of multilayer ceramic chip carrier substrates employing so-called ball grid arrays (BGAs) in lieu of lead frames. These types of ceramic chip carrier substrates differ from single-layer ceramic chip carrier substrates in that they include two or more layers of fan-out circuitry on two or more ceramic layers. Significantly, these layers of fan-out circuitry are electrically interconnected by mechanically drilled via holes, which are plated and/or filled with electrically conductive material. In addition, a certain number of such holes extend from the layers of fan-out circuitry to lands on the bottoms of the chip carrier substrates, on which are mounted solder balls (formed in grid arrays, hence the term ball grid array.) These solder balls are intended to be mechanically and electrically connected to corresponding solderable contact pads on a PCB or PCC. Unfortunately, the mechanically drilled holes electrically interconnecting the layers of fan-out circuitry have relatively large diameters, requiring the spacing between the fan-out wires to be relatively large. But, this relatively large spacing between fan-out wires limits the number of chip I/Os which can be accomodated by such multilayer ceramic chip carrier substrates.

Other attempts to package chips having a relatively large number of chip I/Os has led to the use of multi-tiered cavities in multi-layered ceramic substrates. (As used herein, the term "cavity" denotes a depression in a substrate, not a hole extending through the thickness of the substrate.) When using such a packaging configuration, a chip is mounted face-up at the bottom of a multi-tiered cavity. Wire bonds are extended from I/O contact pads on the upper surface of the chip to contact pads on each of the exposed upper surfaces of the different layers of the multi-layered ceramic substrate constituting the different tiers of the multi-tiered cavity. While this configuration does make it possible to accomodate a relatively large number of chip I/Os, it does result in relatively long wire bonds extending from the chip to the upper tiers of the multi-tiered cavity. As a consequence, the "time of flight" of corresponding electrical signals is undesirably increased.

Ceramic chip carrier substrates are also limited in terms of their heat dissipation capabilities. For example, in the case of a multilayer ceramic chip carrier having a chip positioned at the bottom of a multi-tiered cavity, heat dissipation is typically achieved by providing a heat sink directly beneath the cavity. But this implies that the heat generated by the chip must necessarily be conducted through the ceramic layer at the bottom of the cavity before reaching the heat sink. As a consequence, the rate of heat dissipation is limited.

Thus, those engaged in the development of chip carriers have sought, thus far without success, chip carriers which: (1) exhibit relatively high electrical signal propagation speeds; (2) accomodate relatively high I/O chips while avoiding the need for mechanically drilled holes to interconnect different layers of fan-out circuitry; (3) exhibit a relatively short "time of flight"; and (4) exhibit a relatively high rate of heat dissipation.

SUMMARY OF THE INVENTION

The invention involves a chip carrier which: (1) exhibits relatively high electrical signal propagation speeds; (2) accomodates relatively high I/O chips while avoiding the need for mechanically drilled holes to interconnect different layers of fan-out circuitry; (3) avoids the use of relatively long wire bonds, and thereby achieves a relatively short "time of flight"; and (4) achieves a relatively high rate of heat dissipation.

Significantly, the inventive chip carrier employs organic dielectric materials, such as the epoxy/glass formulations sold under the trade names FR4 and DriClad, in lieu of ceramic dielectric materials. These organic materials have relatively low dielectric constants, e.g., the dielectric constant of FR4 is 4.0. As a consequence, the inventive chip carrier exhibits relatively high electrical signal propagation speeds.

The inventive chip carrier also employs an organic, photoimageable dielectric layer which serves as a film redistribution layer (FRL). That is, this particular organic dielectric layer is sensitive to light, and is readily selectively exposed to light through a mask, and developed, just like a photoresist, to form via holes (which are herein referred to as photo-vias, to distinguish them from mechanically drilled via holes) in the photoimageable dielectric layer. Significantly, these photo-vias are readily formed to have diameters which are much smaller than the diameters of vias formed using conventional mechanical drilling techniques. For example, the diameter of a conventionally drilled via hole is typically no smaller than about 12 mils (0.012 inches), while the diameter of a photo-via can be as small as, for example, 2 mils (0.002 inches). Consequently, when such a photoimageable dielectric layer (or layers) is incorporated into the inventive chip carrier, it becomes possible to interconnect two (or more) layers of fan-out circuitry without limiting the spacing between fan-out wires to the same degree as when using mechanically drilled vias. As a result, the inventive chip carrier accomodates chips having a larger number of I/Os than was possible with conventional ceramic chip carriers.

The inventive chip carrier further employs a single-tiered cavity to contain a chip, rather than a multi-tiered cavity. As a result, relatively long wire bonds are avoided. Consequently, the inventive chip carrier achieves a relatively short "time of flight" for corresponding electrical signals.

In one embodiment of the invention, thermal via holes are provided beneath the single-tiered cavity, extending to the bottom of the chip carrier, to vent heat produced by the chip to the atmosphere. In another embodiment, a heat sink is provided directly beneath the thermal via holes, to further enhance heat dissipation. In still further embodiments, the chip carrier includes a metallic, e.g., copper, layer, which acts as a heat sink, and the depth of the single-tiered cavity extends to, or even into, the metallic layer. This results in direct physical contact between the chip in the cavity and the heat sink, which results in even greater heat dissipation.

In yet another embodiment, the inventive chip carrier includes at least two organic layers, with a ground plane sandwiched between them. The single-tiered cavity associated with this embodiment has a depth which extends at least to the ground plane. Significantly, this embodiment also includes an almost continuous metal ring which encircles the sidewalls of the cavity and extends vertically to the top surface of the chip carrier. The presence of this metal ring is advantageous because it permits ready electrical contact to the ground plane while avoiding the need for a mechanically drilled via hole extending to the ground plane. As a consequence, the spacing between fan-out wires may be advantageously reduced.

BRIEF DESCRIPTION OF THE DRAWINGS

The invention is described with reference to the accompanying drawings, wherein.

DETAILED DESCRIPTION OF THE PREFERRED EMBODIMENT(S)

The invention involves a chip carrier for wire bond-type chips which: (1) exhibits relatively high electrical signal propagation speeds; (2) readily accomodates relatively high I/O chips; (3) avoids the need for long wire bonds, thereby achieving a relatively short "time of flight" for electrical signals propagating through the wire bonds; and (4) achieves a relatively high rate of heat dissipation.

As noted above, the inventive chip carrier achieves relatively high electrical propagation speeds because it employs organic materials, such as the epoxy/glass formulations sold under the trade names FR4 and DriClad, in lieu of ceramic materials. The inventive chip carrier also readily accomodates relatively high I/O chips because it employs at least one organic photoimageable dielectric layer in which photo-vias have been formed, as a film redistribution layer (FRL), to electrically interconnect two (or more) layers of fan-out circuitry. The inventive chip carrier avoids relatively long wire bonds, and thus achieves a relatively short "time of flight" for electrical signals propagating through the wire bonds, because it employs a single-tiered cavity to contain a chip, rather than a multi-tiered cavity. Further, certain embodiments of the inventive chip carrier also include, for example, thermal vias, or a layer of metallic material, directly beneath the chip to enhance heat transfer.

Figure 1:
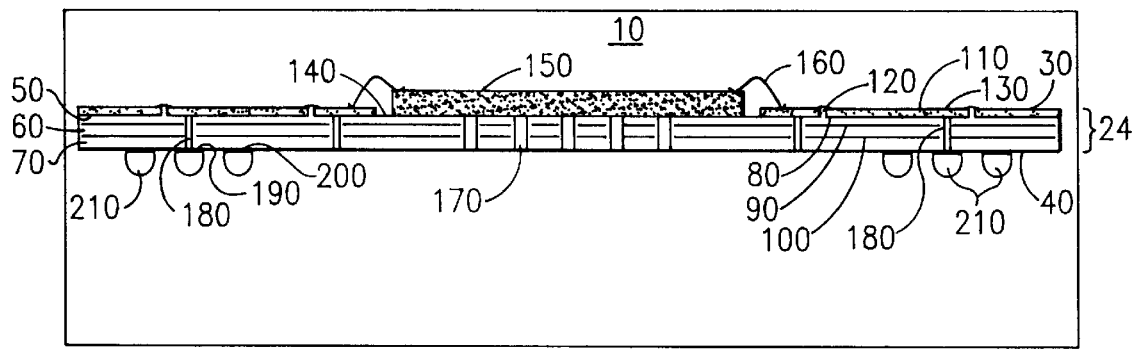
FIG. 1 is a cross-sectional view of a first embodiment of the inventive chip carrier.

With reference now to FIG. 1, a first embodiment of the inventive chip carrier 10 includes a chip carrier substrate 20 having opposed surfaces 30 and 40. This substrate 20 also includes a plurality, e.g., three, of laminated, organic dielectric layers 50, 60 and 70 consisting of, for example, the epoxy/glass formulations sold under the trade names FR4 and DriClad. Although not clearly shown in FIG. 1, the organic dielectric layer 50 serves to support a layer 80 of fan-out circuitry of, for example, copper. Sandwiched between the organic dielectric layers 50 and 60 is a layer 90 of electrically conductive material, e.g., copper, which serves as a power plane. Sandwiched between the organic dielectric layers 60 and 70 is another layer 100 of electrically conductive material, e.g., copper, which serves as a ground plane.

The thickness of each of the organic dielectric layers 50, 60 and 70 ranges from about 2 mils to about 20 mils. Thicknesses less than about 2 mils are undesirable because the corresponding organic dielectric layers are undesirably flimsy, unreliable and difficult to handle. Thicknesses greater than about 20 mils are undesirable because such thick dielectric layers are generally unnecessary and it is difficult to drill via holes into such thick layers.

The thickness of each of the layers 80 (fan-out circuitry), 90 (power plane) and 100 (ground plane) of electrically conductive material ranges from about 0.125 mils to about 2.5 mils. Thicknesses less than about 0.125 mils are undesirable because the corresponding electrically conductive layers often prove incapable of withstanding the types of temperature excursions to which the chip carrier is likely to be subjected. Thicknesses greater than about 2.5 mils are undesirable because it takes an undesirably long time to form such thick layers using conventional plating techniques, and difficulties associated with linewidth control are substantially increased.

As shown in FIG. 1, the chip carrier substrate 20 also includes an organic photoimageable dielectric layer 110 which overlies the layer 80 of fan-out circuitry. A useful composition of the layer 110 is, for example, that of the photoimageable cationically polymerizable epoxy based material described in U.S. Pat. No. 5,026,624, which is hereby incorporated by reference. This particular material includes an epoxy resin system consisting essentially of between about 10% and about 80% by weight of a polyol resin which is a condensation product of epichlorohydrin and bisphenol A having a molecular weight of between about 40,000 and 130,000; between about 20% and about 90% by weight of an epoxidized octafunctional bisphenol A formaldehyde novolac resin having a molecular weight of 4,000 to 10,000; and if flame retardancy is required between about 35% and 50% by weight of an epoxidized glycidyl ether of tetrabromo bisphenol A having a softening point of between about 60° C. and about 110° C. and a molecular weight of between about 600 and 2,500. To this resin system is added about 0.1 to about 15 parts by weight per 100 parts of resin a cationic photoinitiator capable of initiating polymerization of said epoxidized resin system upon exposure to actinic radiation; the system being further characterized by having an absorbance of light in the 330 to 700 nm region of less than 0.1 for a 2.0 mil thick film. Optionally, a photosensitizer such as perylene and its derivatives or anthracene and its derivatives may be added.

The organic photoimageable dielectric layer 110 is readily deposited using conventional coating techniques, such as curtain coating and roll coating. The thickness of the photoimageable dielectric layer 110 ranges from about 2 mils to about 20 mils. Thicknesses less than about 2 mils are undesirable because it is undesirably difficult to form such thin layers while also achieving desired photoimaging and dielectric properties. Thicknesses greater than about 20 mils are undesirable because it is undesirably difficult to form small photo-vias in such thick layers.

Using conventional photolithographic techniques, the photoimageable dielectric layer 110 is readily selectively exposed to light through a mask, and then developed, to form photo-vias 120 in the layer 110, as shown in FIG. 1. (It should be noted that the exposed regions undergo cross-linking, and thus become less soluble than the unexposed regions in relation to the developer.) These photo-vias 120 are then readily plated with an electrically conductive material, such as copper, using conventional plating techniques.

Although not clearly shown in FIG. 1, the photoimageable dielectric layer 110 supports a layer of fan-out circuitry 130 of, for example, copper, which includes contact pads. As should be obvious, the plated photo-vias 120 in the photoimageable dielectric layer 110 serve to electrically interconnect the layers 130 and 80 of fan-out circuitry. Significantly, as noted above, the diameters of the photo-vias are smaller than the diameters of mechanically drilled via holes. Consequently, the spacing between the fan-out wires can be smaller than was previously the case.

As shown in FIG. 1, the chip carrier substrate 20 includes a single-tiered cavity 140, having a depth which extends only through the thickness of the photoimageable dielectric layer 110. A wire bond-type chip 150 is positioned face-up in the bottom of the cavity, with wire bonds 160 extending from contact pads on the chip 150 to contact pads of the layer of fan-out circuitry 130.

Preferably, as shown in FIG. 1, the chip carrier substrate 20 includes (mechanically drilled) thermal via holes 170 which are positioned directly beneath the chip 150 and extend through the thicknesses of the organic layers 80, 90 and 100. These thermal via holes 170 serve to vent the heat produced by the chip 150 to the atmosphere, and thus serve to enhance heat dissipation. (It should be noted that these thermal via holes are preferably filled with a silver-filled epoxy paste to enhance heat transfer. It should also be noted that in the final stages of fabrication, a layer of solder mask material is applied to the surface 40 of the chip carrier 10, and thus this solder mask material overlies the silver-filled epoxy paste.)

The diameters of the thermal via holes 170 ranges from about 6 mils to about 12 mils. Diameters smaller than about 6 mils are undesirable because the corresponding thermal via holes achieve undesirably little heat transfer. Diameters greater than about 12 mils are undesirable because the layer of solder mask material in contact with the silver-filled epoxy paste in the corresponding thermal via holes tends to crack, and the overlying chip tends to delaminate from the chip carrier substrate.

As shown in FIG. 1, the chip carrier substrate 20 further includes a plurality of mechanically drilled, plated via holes 180. Each such hole 180 terminates at the surface 40, where it is encircled by an electrically conductive land 190 of, for example, copper, attached to the surface 40. Also attached to the surface 40 are a plurality of electrically conductive pads 200, as well as electrical circuit lines (not shown) of, for example, copper, which connect the pads 200 to plated via holes 180. Mounted on the lands 190 and pads 200 are solder balls 210, each having a composition which includes, for example, 67% lead and 33% tin. As should be obvious, these solder balls are to be attached to solderable contact pads on a PCB or PCC.

Figure 2:
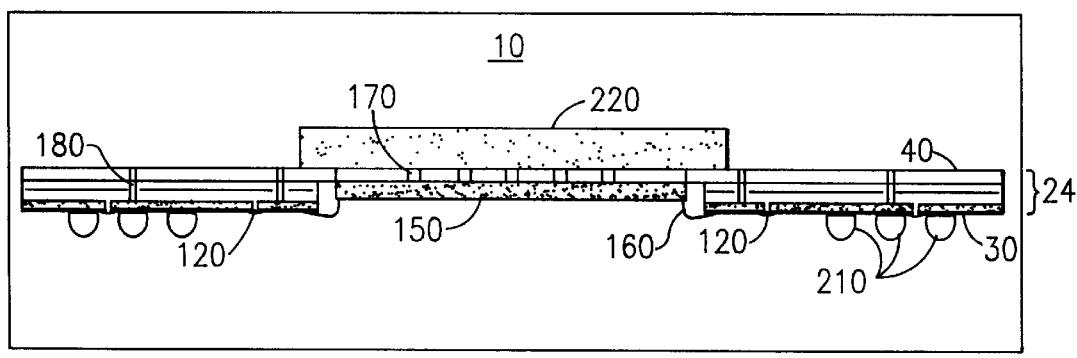
FIG. 2 is a cross-sectional view of a second embodiment of the inventive chip carrier.

With reference now to FIG. 2, a second embodiment of the chip carrier 10 differs from the first embodiment in that the depth of the single-tiered cavity 140 also extends through, for example, the organic layers 80 and 90. In addition, a heat sink 220 is attached to the surface 40, substantially vertically aligned with the chip 150 and the thermal via holes 170. Moreover, the solder balls 210 are attached to lands and pads on the surface 30.

Figure 3:
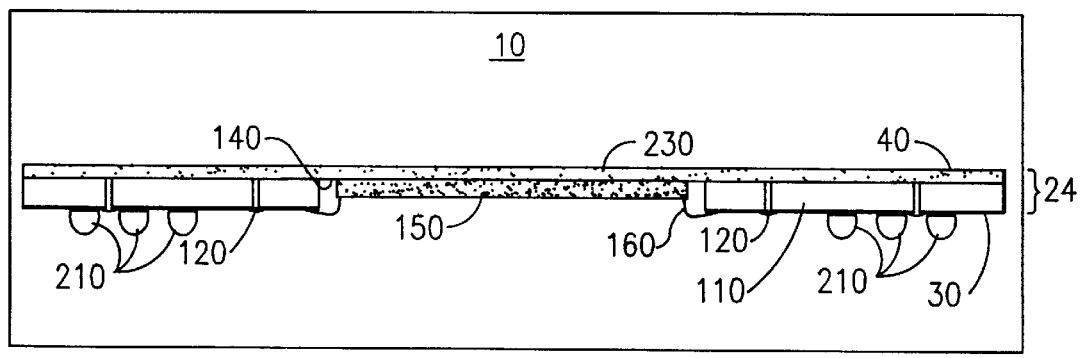
FIG. 3 is a cross-sectional view of a third embodiment of the inventive chip carrier.

With reference now to FIG. 3, a third embodiment of the chip carrier 10 differs from the first and second embodiments in that the chip carrier substrate 20 includes a relatively thick, photoimageable dielectric layer 110, immediately adjacent the surface 30, and a layer 230 of metallic material, e.g., copper, immediately adjacent the surface 40. Here, the layer 230 acts, in part, as a stiffener and is preferably electrically grounded. On the other hand, as before, the photoimageable dielectric layer 110 bears a layer 130 of fan-out circuitry, including contact pads. In addition, the photoimageable dielectric layer 110 includes photo-vias 120 extending through the thickness of layer 110 to the electrically grounded metallic layer 230. Moreover, solder balls 210 are attached to some of the contact pads of the layer 130 of fan-out circuitry.

As shown in FIG. 3, the third embodiment of the chip carrier 10 includes a single-tiered cavity 140 which extends through the thickness of the photoimageable dielectric layer 110 to the layer 230 of metallic material. A wire bond-type chip 150 sits in the bottom of the cavity 140, and is thus in direct physical contact with the metallic layer 230. As a result, heat dissipation is enhanced because the metallic layer 230 also acts as a heat sink.

In this third embodiment of the chip carrier 10, the thickness of the photoimageable dielectric layer 110 ranges from about 2 mils to about 20 mils. Thicknesses outside this range are undesirable for the reasons given above.

The thickness of the metallic layer 230 ranges from about 4 mils to about 20 mils. Thicknesses less than about 4 mils are undesirable because the corresponding metallic layers are undesirably lacking in rigidity. Thicknesses greater than about 20 mils are undesirable because the coefficients of thermal expansion (CTEs) of the corresponding metallic layers then dominate the CTEs of the corresponding chip carriers substrates, which leads to CTE mismatches between the chip carrier substrates and the corresponding chips, which, in turn, leads to cracking of the chips.

Figure 4:
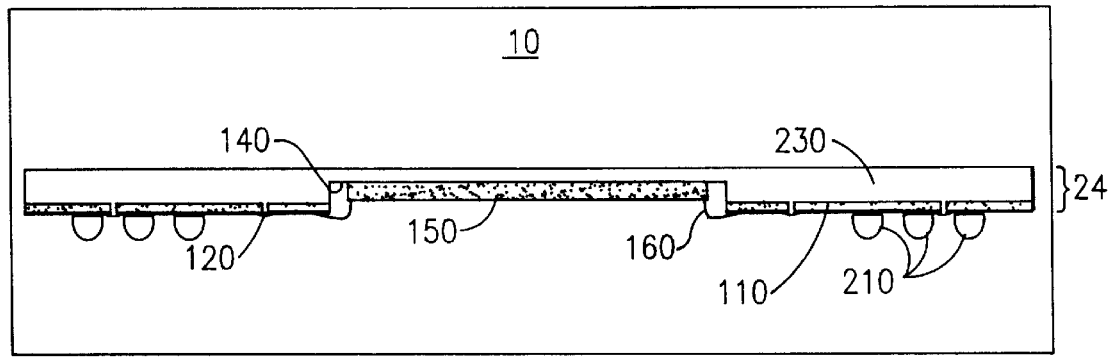
FIG. 4 is a cross-sectional view of a fourth embodiment of the inventive chip carrier.

With reference now to FIG. 4, a fourth embodiment of the chip carrier 10 differs from the third embodiment in that the photoimageable dielectric layer 110 is relatively thin, and the metallic layer 230 is relatively thick. In addition, the depth of the single-tiered cavity 140 extends through the full thickness of the photoimageable layer 110, and partially through the thickness of the metallic layer 230.

In the fourth embodiment of the chip carrier 10, the thickness of the photoimageable dielectric layer 110 still ranges from about 2 mils to about 20 mils. Thicknesses outside this range are undesirable for the reasons given above.

The (full) thickness of the metallic layer 230 again ranges from about 4 mils to about 20 mils. Thicknesses outside this range are also undesirable for the reasons given above.

The (partial) thickness of the metallic layer 230 immediately beneath the cavity 140 should be at least about 4 mils. Thicknesses less than about 4 mils are undesirable because the corresponding metallic layers exhibit undesirably little rigidity.

Figure 5:
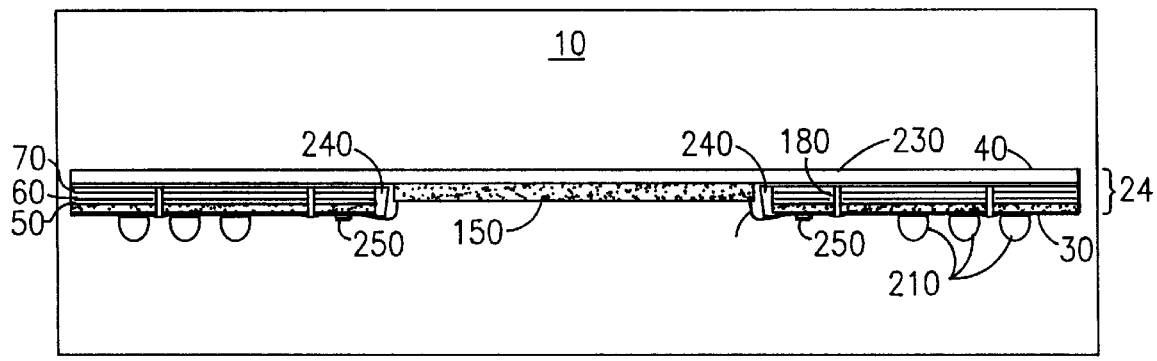
FIG. 5 is a cross-sectional view of a fifth embodiment of the inventive chip carrier.

With reference now to FIG. 5, a fifth embodiment of the chip carrier 10 is similar to the first and second embodiments in that the chip carrier substrate 20 includes a plurality, e.g., three, of laminated organic dielectric layers 50, 60 and 70 consisting of, for example, the epoxy/glass formulation sold under the trade name DriClad. As before, the organic dielectric layer 50 supports a layer 80 of fan-out circuitry, including contact pads. Sandwiched between the organic dielectric layers 50 and 60 is a layer 90 of electrically conductive material, e.g., copper, which serves, in this embodiment, as a ground plane. Sandwiched between the organic dielectric layers 60 and 70 is another layer 100 of electrically conductive material, e.g., copper, which serves as a power plane. It should be noted that the ground plane extends laterally to the sidewalls of the cavity 140, whereas the power plane does not.

The thicknesses of the organic dielectric layers 50, 60 and 70 are similar to those given above. Also, the thicknesses of the electrically conductive layers 80 (fan-out circuitry), 90 (ground plane) and 100 (power plane) are also similar to those given above.

The fifth embodiment of the chip carrier 10 is also similar to the third and fourth embodiments in that the chip carrier substrate 20 also includes a metallic layer 230, which is preferably grounded. The thickness of the metallic layer 230 is similar to that of the metallic layer 230 in the third embodiment.

As shown in FIG. 5, the fifth embodiment of the chip carrier 10 also includes a single-tiered cavity 140, having a depth which extends through the thicknesses of the organic dielectric layers 50, 60 and 70 to the metallic layer 230. A chip 150 sits at the bottom of cavity 140, and is therefore in direct physical contact with the metallic layer 230. Consequently, heat dissipation is enhanced because, as before, the metallic layer 230 acts as a heat sink.

Significantly, the fifth embodiment of the chip carrier 10 differs from the other embodiments in that it includes an almost continuous layer 240 of electrically conductive material, e.g., copper, which is attached to, and encircles, the sidewalls of the cavity 140. This layer 240 extends vertically from the bottom of the cavity 140 to the top of the cavity 140, and extends laterally onto the upper surface of the organic dielectric layer 50, adjacent to the layer 80 of fan-out circuitry. Because the ground plane 90 extends laterally to the sidewalls of the cavity 140, the layer 240 is in direct physical and electrical contact with the ground plane, and is therefore electrically grounded.

The presence of the layer 240 is advantageous because the need for a plurality of mechanically drilled via holes extending through the thickness of the organic dielectric layer 50 to the ground plane 90 is reduced. Thus, if certain chip contact pads are to be electrically grounded, wire bonds from these chip contact pads are extended to the portion of the layer 240 on the surface of the organic dielectric layer 50, rather than to lands encircling mechanically drilled via holes extending to the ground plane 90. Because relatively few such mechanically drilled via holes are needed in the fifth embodiment, the spacing between fan-out wires may be advantageously reduced.

It should be noted that the fifth embodiment of the chip carrier 10 includes a mechanically drilled, plated via hole 180 which extends through the thicknesses of the organic dielectric layers 50 and 60 to the power plane 100. Moreover, the fifth embodiment also includes a ring 250 of metal, e.g., copper, which encircles the cavity 140 and physically and electrically contacts the plated via hole 180 which extends to the power plane 100. This ring 250 is advantageous because it eliminates the need for additional via holes which extend to the power plane. Thus, electrical contact to the power plane 100 is achieved merely by electrically contacting the ring 250.

Figure 6:
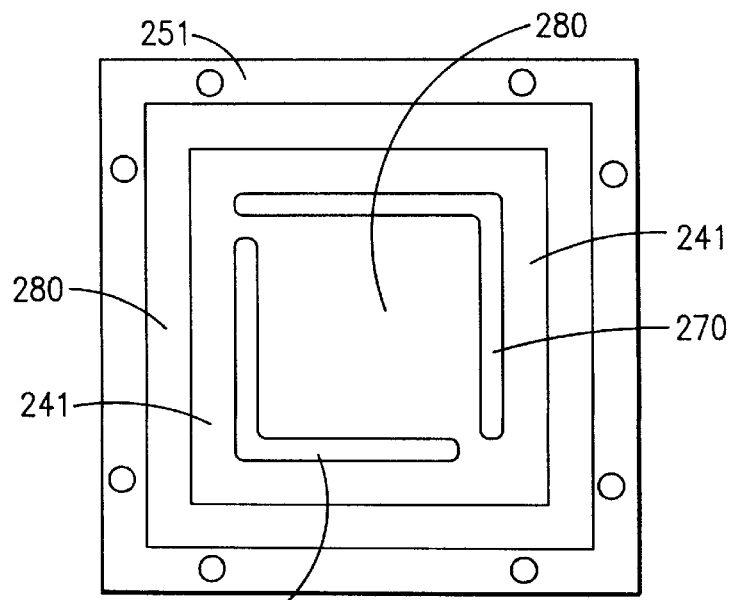
FIG. 6 is a top view of a substrate, depicting the process used to fabricate the fifth embodiment of the inventive chip carrier.

A method for forming the layer 240 and ring 250 is depicted in FIG. 6. As shown in FIG. 6, when forming the cavity 140, two right-angle slits 260 and 270 are mechanically cut through the thicknesses of the organic dielectric layers 50, 60 and 70. The widths of these slits ranges from about 25 mils to about 100 mils. The outer surfaces of these slits define the sidewalls of what is to be the cavity 140. A layer of photoresist 280 is then deposited onto the surface of the organic dielectric layer 50. This layer of photoresist is then exposed and developed so as to leave photoresist covering all of the organic dielectric layer 50, with the exception of the slits 260 and 270, the area 241 on the surface of the organic dielectric layer 50 to be occupied by the layer 240, and the area 251 to be occupied by the ring 250. (It should be noted that this layer of photoresist is supported by the layers of organic dielectric material encircled by the slits 260 and 270.) The slits 260 and 270, the area 241 to be occupied by the layer 240, as well as the area to be occupied by the ring 250, are then metallized using conventional seeding and metal plating techniques. Mechanical cuts are then made through the centerlines of the slits 260 and 270, these cuts are then extended so as to join these centerlines, and the cut-out material is removed. This results in the formation of the cavity 140, leaving metal extending almost continuously (with the exception of the cavity corners to which the slits did not originally extend) around the sidewalls of the cavity 140.

While the invention has been particularly shown and described with reference to preferred embodiments thereof, it will be understood by those skilled in the art that various changes in form and details may be made therein without departing from the spirit and scope of the invention.

We claim:

1. A chip carrier, comprising:

a chip carrier substrate which includes a first surface, a second surface opposed to said first surface, and at least first and second layers of organic material, each being from about 2 mils to about 20 mils thick, at least said first layer of organic material being positioned immediately adjacent said first surface, and being photoimageable and bearing a first layer of electrical circuitry, including contact pads;

a single-tiered photoformed cavity having a depth extending from said first surface toward said second surface, said depth extending at least through a thickness of said first, photoimageable layer; and a semiconductor chip, positioned face-up within said cavity entirely on said organic material, including chip contact pads and wire bonds extending from said chip contact pads to contact pads on said first, photoimageable layer.

2. The chip carrier of claim 1, further comprising:

a second layer of electrical circuitry between said first and second organic layers; and a plurality of photoformed vias containing electrically conductive material, extending through said thickness of said first, photoimageable layer, which serve to electrically connect said first layer of circuitry to said second layer of circuitry.

3. The chip carrier of claim 1, wherein said depth of said single-tiered cavity also extends through at least a portion of a thickness of said second layer of organic material.

4. The chip carrier of claim 1, further comprising a plurality of via holes which extend from a bottom of said cavity, through said substrate, to said second surface.

5. The chip carrier of claim 1, further comprising a heat sink attached to said second surface and substantially aligned with said semiconductor chip.

6. The invention as defined in claim 5 wherein said heat sink is from about 4 mils to about 20 mils thick.

7. The chip carrier of claim 1, further comprising a plurality of electrically conductive pads and/or lands attached to said second surface, and solder balls attached to said pads and/or lands.

8. The chip carrier of claim 1, wherein said first layer of electrically conductive circuitry includes a plurality of electrically conductive pads and/or lands, and wherein said chip carrier further comprises solder balls attached to said pads and/or lands.

9. The invention as defined in claim 1 wherein said second layer of organic material is non-photoimageable.

10. The invention as defined in claim 9 wherein said second layer of organic material is an epoxy/glass formulation.

11. The invention as defined in claim 9 wherein there is a third layer of non-photoimageable organic material between said first and second layers of organic material;

said third layer of organic material being between about 2 mils and about 20 mils thick.

12. The invention as defined in claim 11 wherein said semi-conductor chip is mounted on said third layer of organic material.

13. The invention as defined in claim 11 wherein said cavity extends through said third layer of organic material and said semi-conductor chip is mounted on said second layer.

14. The invention as defined in claim 9 further characterized by a third layer of organic material between about 2 mils and about 20 mils thick between said first and second layers of organic material.

15. The invention as defined in claim 14 wherein said semi-conductor chip is mounted on said third layer of organic material.

16. The invention as defined in claim 14 wherein said cavity extends through said third layer of organic material and said semi-conductor chip is mounted on said second layer of organic material.

* * * * *